(12) United States Patent
Moballegh et al.

(10) Patent No.: US 10,236,892 B2
(45) Date of Patent: Mar. 19, 2019

(54) SYSTEM AND METHOD FOR MAINTAINING HIGH SPEED COMMUNICATION

(71) Applicant: Samsung Display Co., Ltd., Yongin-si, Gyeonggi-do (KR)

(72) Inventors: Shiva Moballegh, Campbell, CA (US); Jalil Kamali, San Jose, CA (US); Gaurav Malhotra, Cupertino, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/961,802

(22) Filed: Apr. 24, 2018

(65) Prior Publication Data
US 2018/0316356 A1    Nov. 1, 2018

Related U.S. Application Data

(60) Provisional application No. 62/492,856, filed on May 1, 2017.

(51) Int. Cl.
| | | |
|---|---|---|
| H03L 7/08 | (2006.01) | |
| H04L 7/033 | (2006.01) | |
| H03L 7/087 | (2006.01) | |
| H03L 7/091 | (2006.01) | |

(52) U.S. Cl.
CPC ........... *H03L 7/0807* (2013.01); *H03L 7/087* (2013.01); *H03L 7/091* (2013.01); *H04L 7/033* (2013.01)

(58) Field of Classification Search
CPC . H04L 7/033; H04L 7/0025; H04L 25/03267; H04L 25/03261; H04L 1/205; H04L 7/002; H03L 7/087; H03L 7/091; H03L 7/0807; H03L 7/08
See application file for complete search history.

(56) References Cited

U.S. PATENT DOCUMENTS

| | | |
|---|---|---|
| 5,648,991 A | 7/1997 | Namekata et al. |
| 5,699,389 A | 12/1997 | Beladi et al. |
| 5,920,220 A | 7/1999 | Takao et al. |
| 7,489,749 B2 | 2/2009 | Liu |
| 8,199,865 B2 | 6/2012 | Hui et al. |
| 9,306,732 B2 | 4/2016 | Huang et al. |
| 2007/0140702 A1 | 6/2007 | Immink et al. |
| 2018/0278405 A1* | 9/2018 | Yao ...................... H04L 7/0008 |

OTHER PUBLICATIONS

Zerbe, Jared, L., et al., "Equalization and Clock Recovery for a 2.5-10-Gb/s 2-PAM/4-PAM Backplane Transceiver Cell", IEEE Journal of Solid-State Circuits, vol. 38, Issue: 12, Dec. 15, 2003, 10 pages.
Kim, Jaeha, et al., "Multi-Gigabit-Rate Clock and Data Recovery Based on Blind Oversampling", IEEE Communications Magazine, vol. 41, Issue: 12, Dec. 19, 2003, 7 pages.

* cited by examiner

*Primary Examiner* — Rahel Guarino
(74) *Attorney, Agent, or Firm* — Lewis Roca Rothgerber Christie LLP

(57) ABSTRACT

A data communication system includes a transmitter, a channel, and a receiver includes a Clock and Data Recovery (CDR) phase detector that is configured to: calculate an overall pulse response of the data communication system; obtain a function value for each of a plurality of phases, the plurality of phases corresponding to a resolution per symbol; set a crossing phase to be a phase at which this value is minimum among the plurality of phase; and set the CDR locking phase to be the crossing phase plus a midpoint from among the plurality of phases.

20 Claims, 5 Drawing Sheets

SYSTEM AND METHOD FOR MAINTAINING HIGH SPEED COMMUNICATION

CROSS-REFERENCE TO RELATED APPLICATION(S)

The present application claims priority to and the benefit of U.S. Provisional Patent Application No. 62/492,856 filed on May 1, 2017, the content of which is incorporated herein by reference in its entirety.

BACKGROUND

1. Field

One or more aspects of embodiments disclosed herein relate to a system and method to determine the Clock and Data Recovery (CDR) locking phase in high speed links.

2. Description of Related Art

The ever increasing demand for higher data rates exacerbates Inter-Symbol Interference (ISI) caused by dispersive channels on high speed serial links. This motivates the use of advanced equalization schemes at both transmitter and receiver ends, whose optimal operation has been a constant challenge from both communication and circuit design standpoints. The most accurate approach to guarantee optimal operation of such systems is through analytical methods, which use the knowledge of the channel (typically measured) and the transceiver model to produce Bit Error Rate (BER) of the system. Given the overall response (channel+transceiver), one still needs to know the phase that the Clock and Data Recovery (CDR) system converges to in order to predict the system performance.

The above information disclosed in this Background section is only for enhancement of understanding of the background and therefore it may contain information that does not constitute prior art.

SUMMARY

Aspects of embodiments of the present disclosure are directed toward a system and method for determining a Clock and Data Recovery (CDR) locking phase in a data communication system.

According to some example embodiments of the present disclosure, in a method for determining a CDR locking phase in a data communication system, the method includes: calculating, by a processor, an overall pulse response of the data communication system; obtaining, by the processor, a function value for each of a plurality of phase, the plurality of phases corresponding to a resolution per symbol; setting, by the processor, a crossing phase to be a phase at which the function value is minimum from among the plurality of phases; and setting, by the processor, the CDR locking phase to be the crossing phase plus a midpoint from among the plurality of phases.

According to some example embodiments, the data communication system includes a plurality of channels, and the function value includes an expected value of a logic output corresponding to the plurality of channels.

According to some example embodiments, obtaining the function value for each of a plurality of phases includes calculating the function value corresponding to all of the plurality of phases at each of the plurality of phases.

According to some example embodiments, the data communication system includes a plurality of channels, and the obtaining the function value includes an expected value of a logic output corresponding to the plurality of channels.

According to some example embodiments, the data communication system includes a SerDes link.

According to some example embodiments of the present disclosure, a receiver for a data communication system, the receiver includes a CDR phase detector, wherein the CDR phase detector is configured to calculate an overall pulse response of the data communication system; obtain a function value for each of a plurality of phases, the plurality of phases corresponding to a resolution per symbol; set a crossing phase to be a phase at which the function value is minimum from among the plurality of phases; and set the CDR locking phase to be the crossing phase plus a midpoint from among the plurality of phases.

According to some example embodiments, the data communication system includes a plurality of channels, and the function value includes an expected value of a logic output corresponding to the plurality of channels.

According to some example embodiments, the CDR phase detector is configured to calculate the function value corresponding to all of the plurality of phases at each of the plurality of phases.

According to some example embodiments, the data communication system includes a plurality of channels, and the function value includes an expected value of a logic output corresponding to the plurality of channels.

According to some example embodiments, the receiver further includes a deserializer of a SerDes link for the data communication system.

According to some example embodiments, the receiver further includes a continuous time linear equalizer (CTLE) configured to receive data transmitted over a channel of the data communication system; a decision-feedback equalizer (DFE) coupled to the CDR phase detector; and a deserializer configured to deserialize the data received over the channel.

According to some example embodiments, the CDR phase detector includes an Alexander Phase Detector.

According to some example embodiments of the present disclosure, a data communication system including a transmitter configured to transmit data; a channel configured to carry the data from the transmitter; and a receiver configured to receive the data over the channel, the receiver including a Clock and Data Recovery (CDR) phase detector, wherein the CDR phase detector is configured to: calculate an overall pulse response of the data communication system; obtain a function value for each of a plurality of phases, the plurality of phases corresponding to a resolution per symbol; set a crossing phase to be a phase at which the function value is minimum from among the plurality of phases; and set the CDR locking phase to be the crossing phase plus a midpoint from among the plurality of phases.

According to some example embodiments, the channel includes a plurality of channels, and the function value includes an expected value of a logic output corresponding to the plurality of channels.

According to some example embodiments, the CDR phase detector is configured to calculate the function value corresponding to all of the plurality of phases at each of the plurality of phases.

According to some example embodiments, the channel includes a plurality of channels, and the function value includes an expected value of a logic output corresponding to the plurality of channels.

According to some example embodiments, the transmitter and the receiver constitute a SerDes Link.

According to some example embodiments, the CDR phase detector includes an Alexander's Phase Detector.

According to some example embodiments, the receiver further includes: a continuous time linear equalizer (CTLE) configured to receive the data transmitted over the channel; a decision-feedback equalizer (DFE) coupled to the CDR phase detector; and a deserializer configured to deserialize the data received over the channel.

According to some example embodiments, the transmitter includes: a serializer configured to serialize the data; and a linear finite-impulse-response filter (TxFIR) interposed between the serializer and the channel.

BRIEF DESCRIPTION OF THE DRAWINGS

Some embodiments can be understood in more detail from the following description taken in conjunction with the accompanying drawings, of which.

DETAILED DESCRIPTION

Figure 1:
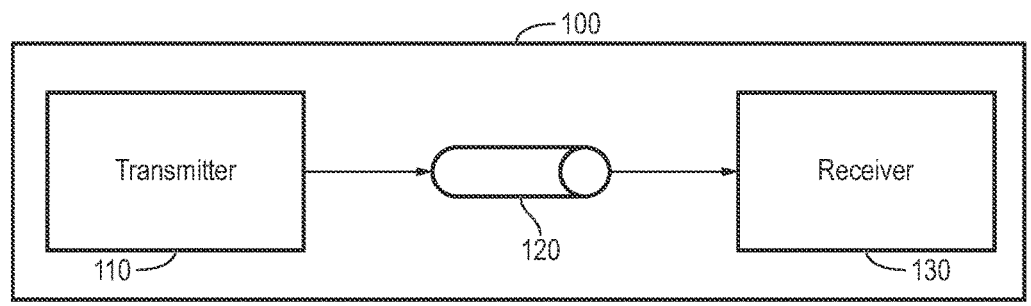
FIG. 1 is a system diagram of a basic data transmission link.

Inter-symbol Interference (ISI) is a dominant source of signal attenuation in Serializer/Deserializer (SerDes) high speed links. The linear finite-impulse-response (FIR) filter at the transmitter (TxFIR) and the decision-feedback equalizer (DFE) at the receiver are commonly used to compensate for both pre-cursor and post-cursor ISI. For example, DFE is a type of equalizer that is used at the receiver side in order to remove some of the interferences from the channel. The most popular adaptation strategy for DFE coefficients is to utilize a least mean square (LMS) algorithm which provides a minimum mean-squared-error (MMSE) solution that may effectively eliminate the post-cursor ISI at data samples. Although DFE may optimally minimize ISI over a finite number of post-cursor taps, the overall equalization optimality may be highly dependent on the CDR locking phase. Moreover, if the CDR is placed after the DFE summing node, the interaction between the CDR loop and the DFE adaptation loop may result in a suboptimal overall performance.

There is currently no consented criterion for the optimality of the overall system in the literature. Some authors consider the optimum CDR locking phase the one which minimizes pre-cursor ISI, while some take the one which maximizes the voltage margin at the data sampling. However, it should be noted that none of the assumptions above would guarantee to minimize BER which may be the ultimate metric for the link. Considering BER as the metric, the CDR-DFE interaction may actually be favorable as it can reduce the pre-cursor ISI depending on the equalization level besides reducing the ISI jitter at the CDR output.

The electronic or electric devices and/or any other relevant devices or components according to embodiments of the disclosure described herein, such as, for example, a transmitter, a receiver, a serializer, a deserializer, FIR, CTLE, DFE, CDR, etc., may be implemented utilizing any suitable hardware, firmware (e.g., an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the disclosure.

Unless otherwise defined, all terms (including technical and scientific terms) used herein have the same meaning as commonly understood by one of ordinary skill in the art to which embodiments of the disclosure belong. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a system diagram of a basic data transmission link. Referring to FIG. 1, a basic data transmission link has a transmitter 110 that sends a signal through a channel 120 to a receiver 130. As the transmission speed in the channel 120 increases, the effect of Inter-Symbol Interference (ISI) would generally also increase correspondingly.

Figure 2:
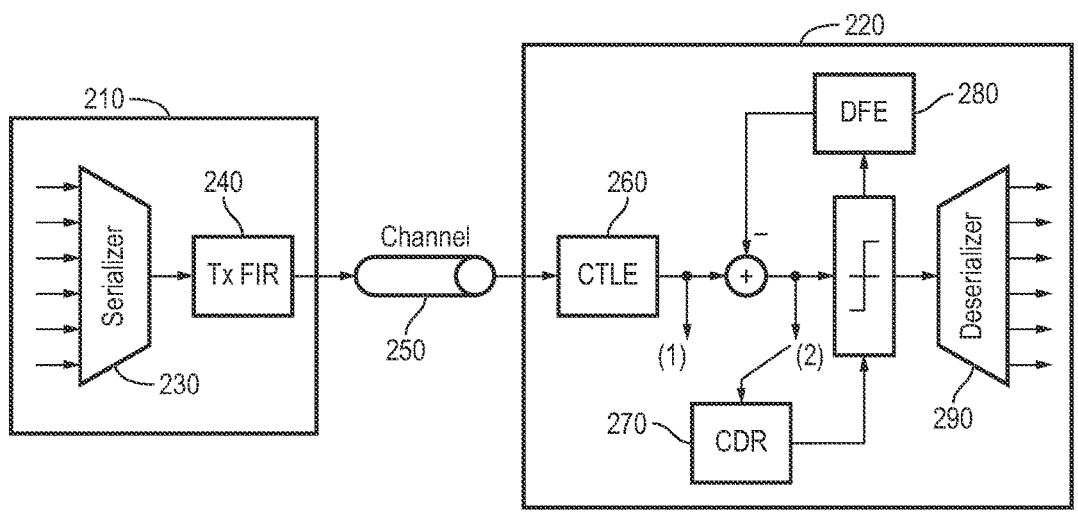
FIG. 2 is a system diagram of a SerDes high speed link architecture.

FIG. 2 is a system diagram of a SerDes high speed link architecture, which may also be referred to as a data transmission system or a data communication system.

Referring to FIG. 2, the SerDes high speed link includes a transmitter 210 and a receiver 220 that are coupled to each other via a channel 250. The SerDes transmitter 210 includes a serializer 230 and a linear finite-impulse-response (FIR) filter (TxFIR) 240. The receiver 220 includes a continuous time linear equalizer (CTLE) 260, a decision-feedback equalizer (DFE) 280, a Clock and Data Recovery (CDR) phase detector 270, and a deserializer 290. While only one channel 250 is illustrated in FIG. 2, the present disclosure is not limited thereto, and the system may include multiple (e.g., 4 or more) channels in parallel between transmission and receiving ends according to example embodiments of the present disclosure.

Under linear system modeling framework, each block can be represented by its impulse response. The overall impulse response of the system $h_{tot}$ may be determined by sampling data at slicer inputs, (1) and (2) shown in FIG. 2, and by convolving all of the equivalent impulse responses including the impulse response of the Tx FIR 240. A processor may sample impulse responses at a finite sampling rate. The finite sampling rate may be denoted as $N_{ph}$, which is the number of samples per a symbol. Ultimately, to find the bit-wise impulse response, $h_{txt}$ should be decimated by $N_{ph}$ and it is the decision of the CDR phase detector 270 to pick one phase out of $N_{ph}$ different phases as the sampling (decimation) phase. It is desirable to find this particular phase for different scenarios.

In some embodiments, the CDR phase detector 270 is based on a simple Alexander Phase Detector (PD) principle, also known as the early-late detection technique. In some embodiments, the CDR phase detector 270 may be a processor. The Alexander PD is a bang-bang system that only provides sign information (e.g., +1 or −1 and not magnitude) of phase error, thereby exhibiting a highly nonlinear behavior. Consequently, a CDR loop utilizing this PD locks such that the non-sampling edge of the recovered clock coincides with the data zero crossing. It is then intuitively expected that the CDR converges to the phase that leads to a decimated version of $h_{txt}$ with zero expected value of absolute signal amplitude at the crossing.

In some embodiments according to the present disclosure, the above condition may be simplified into an easily verifiable formula and then confirmed through the simulation.

Figure 3:
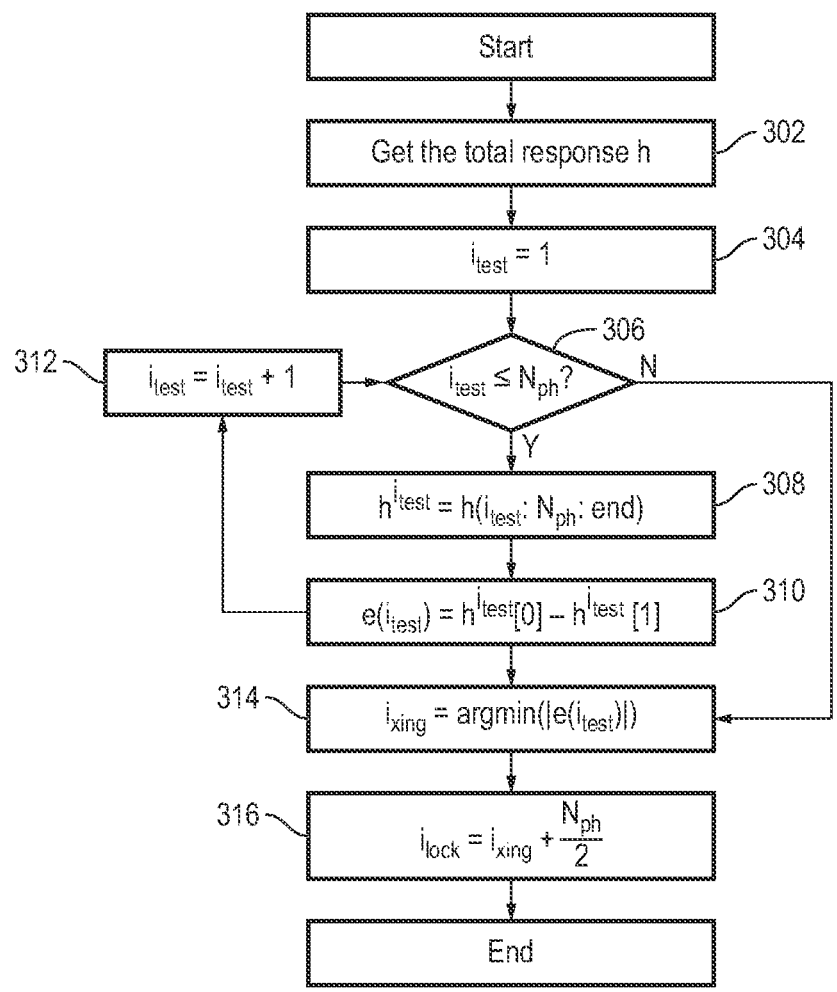
FIG. 3 displays a flow diagram illustrating a first embodiment of the present disclosure FIG. 4 displays a flow diagram illustrating a second embodiment of the present disclosure.

FIG. 3 displays a flow diagram illustrating a first embodiment of the present disclosure.

The flow diagram in FIG. 3 is based on the following equations Eq. 1-1, Eq. 1-2 and Eq. 1-3:

$$E\{|y_n[i_{xing}]|\} = E\{|\Sigma_k h^{ixing}[k]d[n-k]|\} = 0, \quad \text{(Eq. 1-1)}$$
$$h^{ixing} = h(i_{xing}: N_{ph}: \text{end})$$

$$E\{|y_n[i_{xing}]| \mid d[n]d[n-1] = -1\} = h^{ixing}[0] - h^{ixing}[1] = 0 \quad \text{(Eq. 1-2)}$$

$$i_{lock} = i_{xing} + \frac{N_{ph}}{2} \quad \text{(Eq. 1-3)}$$

Each of the variables of the equations above, as well as the equations that follow, can be defined as follows:

d[n]: the nth transmit bit
$N_{ph}$: the phase interpolator/simulation resolution per symbol
i∈[1, $N_{ph}$]: a phase within the range of PI/simulation resolution
$y_n$[i]: signal amplitude corresponding to d[n], at an arbitrary phase i∈[1, $N_{ph}$]
h: the overall pulse response of the channel
$h^i$: the overall impulse response at phase i∈ [1, $N_{ph}$]
$i_{xing}$: CDR crossing phase
$i_{lock}$: CDR locking phase As can be seen above, according to some example embodiments of the present disclosure, the locking phase is realized when the expected value of the absolute value of the signal $y_n[i_{xing}]$ equals to zero.

According to the embodiment shown in FIG. 3, the CDR phase detector 270 samples data before the DFE 280. This sampling point is indicated as (1) in FIG. 2. When the CDR phase detector 270 is placed before the DFE 280, it effectively operates over an under-equalized signal. This will decouple the CDR Phase Detector 270 from the DFE adaptation loop and reduces or eliminates the risk of their unstable interaction. However, such configuration forces the CDR to operate before the DFE 280 is applied where the eye diagram may not be quite open. Therefore, this architecture is usually not used despite the more reliable and faster operation of the CDR Phase Detector 270 when it gets decoupled from the DFE 280. The CDR sampling phase for this scenario can be calculated by avoiding any DFE 280 interaction. According to some embodiments, it is to be assumed that slicing happens at phase i where i∈[1, $N_{ph}$], and $h_{tot}^i$ is the sampled version of $h_{tot}$ at phase i in Eq. 2-1:

$$h_{tot}^i = h_{tot}(i+kN_{ph}), k=0, 1, \ldots \quad \text{(Eq. 2-1)}$$

Phase i can be found in Eq. 2-2:

$$E\{|y_{xing}^i(k)|\} = E\left\{\left|h_0^{\left(i-\frac{N_{ph}}{2}\right)}d(k) + \Sigma_{n\neq 0}h_n^{\left(i-\frac{N_{ph}}{2}\right)}d(k-n)\right|\right\} = 0 \quad \text{(Eq. 2-2)}$$

In Eq. 2-2 above, d(k) is the $k^{th}$ transmit bit and $h_{tot}^{(i-Nph/2)}$ is the impulse response at phase $i-N_{ph}/2$ corresponding to the zero crossing phase. Accordingly, $h_0^{(i-Nph/2)}$ is the main tap at this phase. If there is a transition from d(k−1) to d(k), e.g. d(k)=1 and d(k−1)=−1, then, in Eq. 2-3:

$$y_{i-\frac{N_{ph}}{2}}^i(k) = h_0^{i-\frac{N_{ph}}{2}} - h_1^{i-\frac{N_{ph}}{2}} + \Sigma_{n\neq 1,0}h_n^{i-\frac{N_{ph}}{2}}d(k-n) \quad \text{(Eq. 2-3)}$$

Conversely, if d(k)=1 and d(k−1)=−1, then in Eq. 2-4:

$$y_{i-\frac{N_{ph}}{2}}^i(k) = h_0^{i-\frac{N_{ph}}{2}} + h_1^{i-\frac{N_{ph}}{2}} + \Sigma_{n\neq 1,0}h_n^{i-\frac{N_{ph}}{2}}d(k-n) \quad \text{(Eq. 2-4)}$$

Thus, the final equation is expressed as Eq. 2-5:

$$E\left\{\left|y_{i-\frac{N_{ph}}{2}}^i(k)\right| \mid d(k)d(k-1) = -1\right\} = h_0^{i-\frac{N_{ph}}{2}} - h_1^{i-\frac{N_{ph}}{2}} = 0 \quad \text{(Eq. 2-5)}$$

assuming that $$h_0^{i-\frac{N_{ph}}{2}} > h_1^{i-\frac{N_{ph}}{2}}.$$

This algorithm according to some example embodiments effectively searches for phase i among [1, $N_{ph}$] which satisfies Eq. 2-5 above or minimizes its absolute value.

The method, according to this embodiment, begins at Step 302 as shown in FIG. 3. In Step 302, the CDR phase detector 270 measures the overall pulse response of the channel h with the sampling frequency of $N_{ph}$×symbol rate. In Step 304, the testing phase $i_{test}$ is set equal to 1 as an initial value. In Step 306, the testing phase $i_{test}$ is compared to the total number of phases per symbol, i.e. the phase interpolator/simulation resolution, $N_{ph}$. If the testing phase is less than or equal to the phase interpolator/simulation resolution per symbol $N_{ph}$, the method will proceed to Step 308.

In Step 308, the overall impulse response $h^{itest}$ for each testing phase $i_{test}$ is measured (or calculated) by decimating h starting from the current testing phase $i_{test}$. In some embodiments, the overall impulse response is measured (or calculated) from the testing phase $i_{test}$ to end, where end is the last measured value of h in the time domain. This means that the overall impulse response is calculated by taking every ($N_{ph}$)th sample of h. By way of example, when $i_{test}=1$ and $N_{ph}=10$, every 10th sample of h (i.e., 1st, 11th, 21st, 31st, etc.) is taken for calculation of the overall impulse response $h^{itest}$. Similarly, when $i_{test}=2$ and $N_{ph}=10$, every 10th sample (i.e., 2nd, 12th, 22nd, 32nd, etc.) is taken for calculation of the overall impulse response $h^{itest}$.

The method proceeds to Step 310. In Step 310, the CDR phase detector 270 calculates the function $e(i_{test})=h^{itset}[0]-h^{itest}[1]$, i.e. the expected value of signal absolute value at the current testing phase $i_{test}$. In the function $e(itest)$, the value [0] corresponds to the main tap (e.g., time=zero) and value [1] corresponds to the following tap (e.g. time=sampling time). The values are apart by sampling time which is equal to the symbol transmission rate of the SerDes link. After calculating the function value (i.e. the value of the output of a function) of $e(i_{test})$ the method proceeds to Step 312. In Step 312, the next testing phase $i_{test}$ is selected by increasing the testing phase $i_{test}$ by 1. After selecting the next testing phase, the method returns to Step 306. In Step 306, the next testing phase is compared with the interpolator/simulation resolution per symbol $N_{ph}$. If the next testing phase is less than or equal to the interpolator/simulation resolution per symbol $N_{ph}$, the method will repeat Steps 308-312. In other words, the process of calculating the value $e(i_{test})$ is continued until the value $e(i_{test})$ is calculated for each of the testing phases $i_{test}$ from the first phase 1 to the last phase $N_{ph}$ according to the resolution of the phases per symbol.

In Step 306, if the testing phase is greater than the phase interpolator/simulation resolution per symbol $N_{ph}$, the function value $e(i_{test})$ has been calculated for each of the testing phases $i_{test}$ from $i_{test}=1$ to $i_{test}=N_{ph}$, so the method proceeds to Step 314, in which the crossing phase $i_{xing}$ is determined. In an ideal case, the crossing phase occurs when the expected value $e(i_{test})$ equals to 0, and the value $e(i_{test})$ of 0 might be achieved according to one or more embodiments of the present disclosure. However, this might not always be the case and the present disclosure is not limited thereto. In some embodiments, the crossing phase $i_{xing}$ is determined by identifying the minimum absolute value of $e(i_{test})$ calculated in Step 310. In Step 314, the crossing phase $i_{xing}$ is set equal to the minimum absolute value $\arg\min(|e(i_{test})|)$ of the value $e(i_{test})$ calculated in Steps 306-312. In Step 316, the final CDR locking phase is set or calculated. In some embodiments, the CDR locking phase is calculated by adding the crossing phase $i_{xing}$ identified in Step 314 to the midpoint of the sample ($N_{ph}/2$), which is simply the number of all phases per symbol $N_{ph}$ (according to the resolution used) divided by 2. By way of example, when the resolution used is 64 phases per symbol, the midpoint is 64/2=32.

Figure 4:
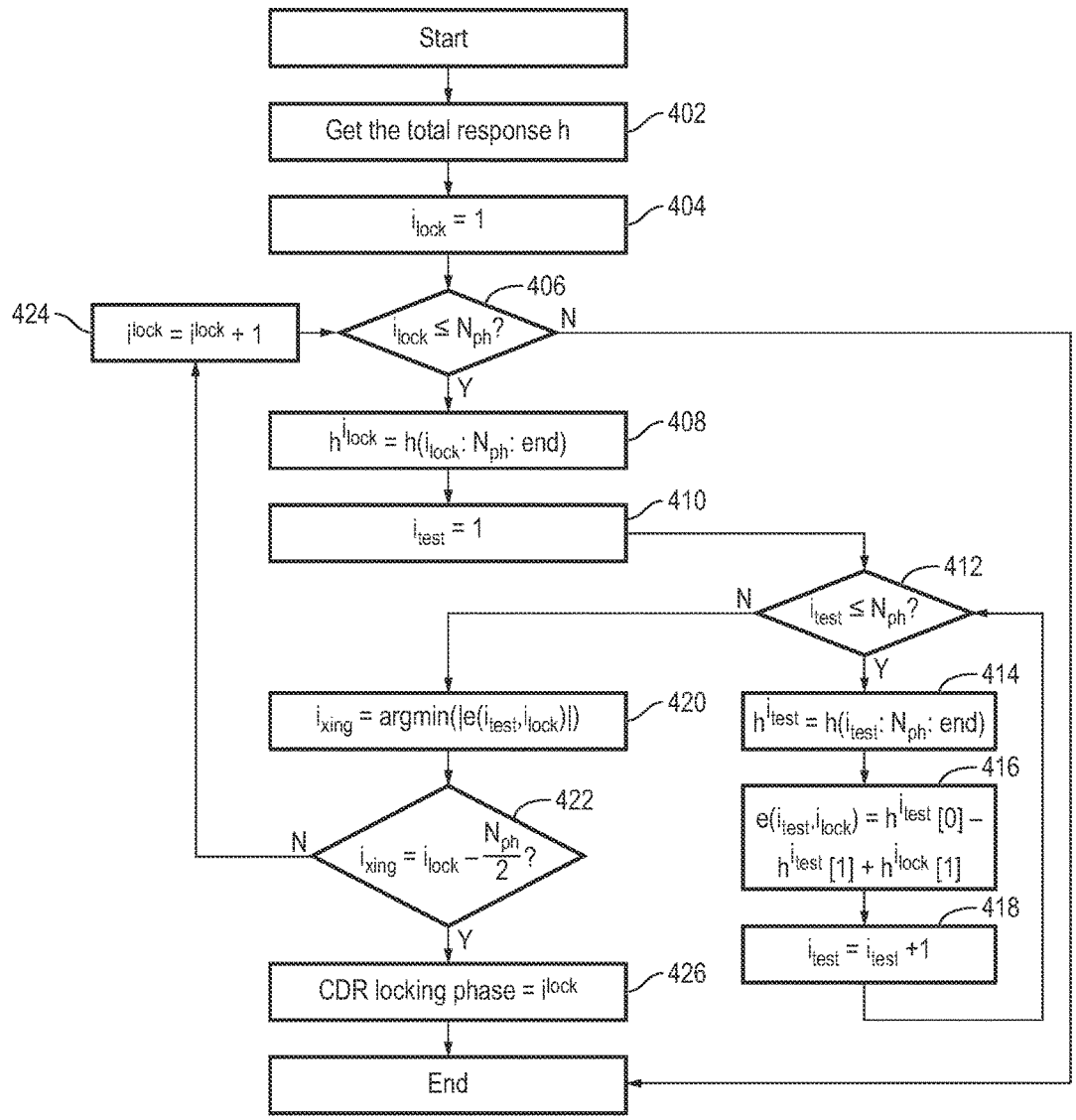

FIG. 4 displays a flow diagram illustrating a second embodiment of the present disclosure.

The flow diagram in FIG. 4 is based on the following equations Eq. 3-1, E1. 3-2, Eq. 3-3 and Eq. 3-4:

$$y_n[i_{xing}] = \Sigma_k\ h^{ixing}[k]d[n-k] - \Sigma_{k \in DFE}\ h^{ilock}[k]d[n-k] \quad \text{(Eq. 3-1)}$$

$$y_n[i_{xing}] = -h^{ixing}[0] + h^{ixing}[1] - h^{ilock}[1] + \quad \text{(Eq. 3-2)}$$
$$\Sigma_{n \neq 1,0}\ h^{ixing}[k]d[n-k] - \Sigma_{n \in DFE, n \neq 1}\ h^{ilock}[k]d[n-k]$$

$$E\{|y_n[i_{xing}]||d[n]d[n-1]=1\} = \quad \text{(Eq. 3-3)}$$
$$h^{ixing}[0] - h^{ixing}[1] + h^{ilock}[1] = 0$$

$$i_{xing} = u_{lock} - \frac{N_{ph}}{2} \quad \text{(Eq. 3-4)}$$

According to the embodiment shown in FIG. 4, the CDR detector 270 samples data after the DFE 280, which sampling point is indicated as (2) in FIG. 2. This arrangement results in CDR phase detector 270 interaction with DFE 280, which can impact the calculation of the CDR locking phase. By way of example, a full-rate CDR Phase Detector with the signal amplitude corresponding to bit $d(k)$ at phase $j \in [1, N_{ph}]$ can be expressed as Eq. 4-1:

$$y_j{}^i(k) = h_0{}^j d(k) + \Sigma_{n \neq 0} h_n{}^j d(k-n) - \Sigma_{n \in DFE\ taps} h_n{}^i d(k-n) \quad \text{(Eq. 4-1)}$$

In Eq. 4-1, i is the CDR sampling phase. Clearly, DFE 280 feedback is based on the impulse response sampled at phase i. Accordingly, the signal amplitude at the transition edge is expressed as Eq. 4-2:

$$y^i{}_{i-\frac{N_{ph}}{2}}(k) = \quad \text{(Eq. 4-2)}$$
$$h_0{}^{i-\frac{N_{ph}}{2}} d(k) + \Sigma_n\ h_n{}^{i-\frac{N_{ph}}{2}} d(k-n) - \Sigma_{n \in DFE}\ h_n^i d(k-n)$$

If there is a transition from $d(k-1)$ and $d(k)$, e.g. $d(k)=1$ and $d(k-1)=-1$, then the equation is expressed as Eq. 4-3:

$$y^i{}_{i-\frac{N_{ph}}{2}}(k) = h_0{}^{i-\frac{N_{ph}}{2}} - h_1{}^{i-\frac{N_{ph}}{2}} + h_1^i + \quad \text{(Eq. 4-3)}$$
$$\Sigma_{n \neq 1,0}\ h_n{}^{i-\frac{N_{ph}}{2}} d(k-n) - \Sigma_{n \in DFE, n \neq 1}\ h_n^i d(k-n)$$

Conversely, if $d(k)=1$ and $d(k-1)=-1$, then the equation is expressed as Eq. 4-4:

$$y^i{}_{i-\frac{N_{ph}}{2}}(k) = -h_0{}^{i-\frac{N_{ph}}{2}} + h_1{}^{i-\frac{N_{ph}}{2}} - h_1^i + \quad \text{(Eq. 4-4)}$$
$$\Sigma_{n \neq 1,0}\ h_n{}^{i-\frac{N_{ph}}{2}} d(k-n) - \Sigma_{n \in DFE, n \neq 1}\ h_n^i d(k-n)$$

Thus, the final equation is expressed as Eq. 4-5:

$$E\{|y^i{}_{i-\frac{N_{ph}}{2}}(k)||d(k)d(k-1)=-1\} = h_0{}^{i-\frac{N_{ph}}{2}} - h_1{}^{i-\frac{N_{ph}}{2}} + h_1^i = 0 \quad \text{(Eq. 4-5)}$$

It should be noted that DFE 280 feedback for $d(k)$ is applied well before the zero crossing at $$i - \frac{N_{ph}}{2}.$$

The algorithm which finds the accurate sampling phase under DFE 280 interactions according to some example embodiments is based on Eq. 4-5. To find the sampling phase without DFE 280 interactions, this equation should be replaced by Eq. 2-5 presented above.

The method, according to the example embodiment illustrated in FIG. 4, begins at Step 402 as shown in FIG. 4. In Step 402, the CDR phase detector 270 measures the overall pulse response of the channel h. In Step 404, the locking phase $i_{lock}$ is set equal to 1 as an initial value. In Step 406, the locking phase is compared to the phase interpolator/simulation resolution per symbol, $N_{ph}$. If the locking phase is less than or equal to the phase interpolator/simulation resolution per symbol $N_{ph}$, the method will proceed to Step 408.

In Step 408, the overall impulse response $h^{ilock}$ for each locking phase $i_{lock}$ is measured (or calculated) starting from the current locking phase $i_{lock}$. In some embodiments, the overall impulse response is measured (or calculated) from the locking phase $i_{lock}$ to end, which means that the overall impulse response is calculated by taking every $(N_{ph})$th sample. By way of example, when $i_{lock}=1$ and $N_{ph}=10$, every 10th sample (i.e. 1st, 11th, 21st, 31st, etc.) is taken for calculation of the overall impulse response $h^{ilock}$. Similarly, when $i_{lock}=2$ and $N_{ph}=10$, every 10th sample (i.e., 2nd, 12th, 22nd, 32nd, etc.) is taken for calculation of the overall impulse response $h^{ilock}$.

The method proceeds to Step 410. In Step 410, the testing phase $i_{test}$ is set equal to 1 as an initial value. In Step 412, the testing phase $i_{test}$ is compared to the phase interpolator/simulation resolution per symbol, $N_{ph}$. If the testing phase is less than or equal to the interpolator/simulation resolution per symbol $N_{ph}$, the method will proceed to Step 414.

In Step 414, the overall impulse response $h^{itest}$ for each testing phase $i_{test}$ is measured (or calculated) starting from the current testing phase $i_{test}$. In some embodiments, the overall impulse response is measured (or calculated) from the testing phase $i_{test}$ to end, which means that all the overall impulse response is calculated by taking every $(N_{ph})$th sample. By way of example, when $i_{test}=1$ and $N_{ph}=10$, every 10th sample (i.e., 1st, 11th, 21st, 31st, etc.) is taken for calculation of the overall impulse response $h^{itest}$.

The method proceeds to Step 416. In Step 416, the CDR phase detector 270 calculates the value $e(i_{test}, i_{lock})$, by finding the difference between $h^{itest}[0]$ and $h^{itest}[1]$ at the current testing phase $i_{test}$ and adding the difference to $h^{ilock}[1]$ at the current locking phase $i_{lock}$. After calculating the value $e(i_{test}, i_{lock})$, the method proceeds to Step 418. In Step 418, the next testing phase is selected by increasing the testing phase by 1. After selecting the next testing phase $i_{test}$, the method returns to Step 412. In Step 412, the next testing phase is compared with the interpolator/simulation resolution per symbol $N_{ph}$. If the next testing phase is less than or equal to the interpolator/simulation resolution per symbol $N_{ph}$, the method will repeat Steps 414-418. In other words, the process of calculating the value $e(i_{test}, i_{lock})$ is continued until $e(i_{test}, i_{lock})$ is calculated for the current locking phase $i_{lock}$ and each of the testing phases $i_{test}$ from the first testing phase 1 to the last testing phase $N_{ph}$ according to the resolution of the phase per symbol.

In Step 412, if the testing phase is greater than the phase interpolator/simulation resolution per symbol $N_{ph}$, the value $e(i_{test}, i_{lock})$ has been calculated for the current locking phase $i_{lock}$ and each of the testing phases $i_{test}$ from $i_{test}=1$ to $i_{test}=N_{ph}$, then the method proceeds to Step 420, in which the crossing phase $i_{xing}$ is determined. In an ideal case, the crossing phase occurs when the expected value of signal absolute amplitude $e(i_{test}, i_{lock})$ equals to 0, and value $e(i_{test}, i_{lock})$ of 0 might be achieved according to one or more embodiments of the present disclosure. However, this might not always be the case and the present disclosure is not limited thereto. In some embodiments, the crossing phase $i_{xing}$ is determined by identifying the minimum absolute value of $e(i_{test}, i_{lock})$ calculated in Step 416. In Step 420, the crossing phase $i_{xing}$ is set when the absolute value arg min($|e(i_{test}, i_{lock})|$) of the values $e(i_{test}, i_{lock})$ calculated in Steps 412-418 is at the minimum.

In Step 422, the crossing phase $i_{xing}$ determined in Step 420 is compared to the difference of the current locking phase $i_{lock}$ and the midpoint of the sample $N_{ph}/2$, which is simply the number of all phases per symbol $N_{ph}$ (according to the resolution used) divided by 2. By way of example, when the resolution used is 64 phases per symbol, the midpoint is 64/2=32. If the crossing phase $i_{xing}$ is equal to the difference, then the method proceeds to Step 426. In step 426, the final CDR locking phase is set equal to the current locking phase $i_{lock}$.

Referring back to Step 422, if the crossing phase is not equal to the difference of the current locking phase $i_{lock}$ and the midpoint of the sample ($N_{ph}/2$), then the method proceeds to Step 424. In Step 424, the next locking phase is selected by increasing the locking phase $i_{lock}$ by 1. After selecting the next locking phase, the method returns to Step 406. In Step 406, the next locking phase is compared with the interpolator/simulation resolution per symbol $N_{ph}$. If the next locking phase is less than or equal to the interpolator/simulation resolution per symbol, the method will repeat Steps 408-422. In other words, the process of calculating the crossing phase $i_{xing}$ is continued until a crossing phase $x_{ing}$ is calculated that is equal to the difference of the locking phase $i_{lock}$ and the midpoint of the sample $N_{ph}/2$ or until each crossing phase $i_{xing}$ is calculated for each of the locking phases $i_{lock}$ from the first locking phase 1 to the last locking phase $N_{ph}$ according to the resolution of the phases per symbol.

In some embodiments, the high speed link incorporates Majority voting logic. The Majority voting logic is used in high speed link systems with multiple data streams and is a common approach to averaging over multiple early-late updates generated by parallel phase detectors. The Majority voting logic impacts the calculation of the CDR locking phase.

Figure 5:
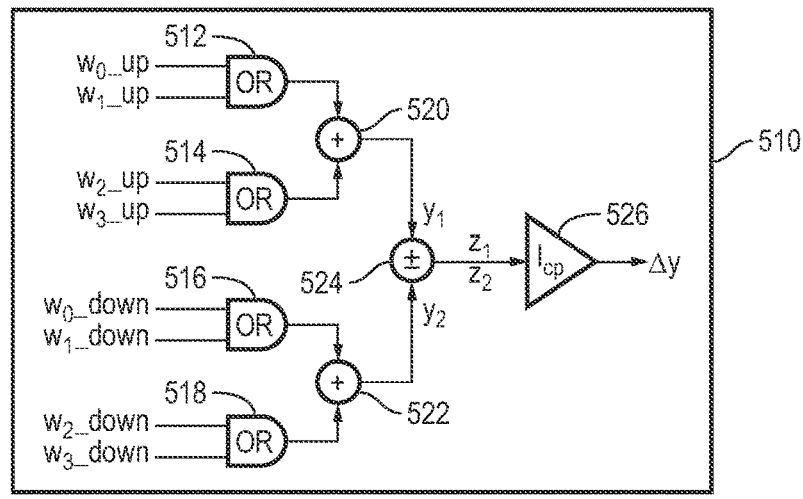
FIG. 5 provides a logic diagram of Quad-Data-Rate (QDR) system.

For the sake of analysis, the CDR runs at quarter-rate and therefore the phase error gets updated every 4 unit-interval (UI), based on four phase error samples $w_0$ to $w_3$. These are 2-bit (1(late), −1(early) or 0 (hold)) samples which correspond respectively to data samples: $d_0$-$d_3$ and their zero-crossings: $x_0$-$x_3$. To generate one final phase-error update, the most straightforward approach is to use an FIR boxcar filter which adds all 2-bit samples producing a single multi-bit [−4 to 4] value. Another approach is utilizing majority voting for the purpose of reducing latency in digital PLL as well as preventing false consecutive corrections which could potentially destabilize the CDR convergence. The implementation schematic of majority vote logic on four phase-error samples is shown in FIG. 5. During each cycle, two independent majority votes are implemented; one across the first set of two samples and the other across the second set of two samples. The LPF input can be expressed as Eq. 5-1:

$$\Delta y = I_{cp}(y_1 - y_2) = \qquad \text{(Eq. 5-1)}$$
$$I_{cp}\left[(w_0 + w_1)\left(1 - \frac{w_0 w_1}{2}\right) + (w_2 + w_3)\left(1 - \frac{w_2 w_3}{2}\right)\right]$$

Therefore, the decision output y can be expressed as equation Eq. 5-2, Eq. 5-3, Eq. 5-4:

$$\Delta y = I_{cp}(z_1 + z_2) \qquad \text{(Eq. 5-2)}$$

$$z_1 = (w_0 + w_1)\left(1 - \frac{w_0 w_1}{2}\right) \qquad \text{(Eq. 5-3)}$$

$$z_2 = (w_2 + w_3)\left(1 - \frac{w_2 w_3}{2}\right) \qquad \text{(Eq. 5-4)}$$

Because $z_1$ and $z_2$ have the same level of contribution in $\Delta y(E\{z_1\}=E\{z_2\})$, the focus may only be on the first term: $z_1$. All analysis presented for $z_1$ can be applied equally to $z_2$. Therefore, the requirement for CDR convergence can be updated as Eq. 5-5 according to some example embodiments:

$$E\{\Delta y\}=E\{z_1\}=0 \quad \text{(Eq. 5-5)}$$

$$E\{z_1\}=\tfrac{1}{8}(E\{z_1|000\}+E\{z_1|001\}+\ldots+E\{z_1|111\})=\tfrac{1}{8}(E\{z_1|001\}+E\{z_1|010\}+\ldots+E\{z_1|110\})=0 \quad \text{(Eq. 5-6)}$$

It should be noted that a case where three consecutive data samples are equal to zero and a case where three consecutive data samples are equal to one can be removed from Eq. 5-6 because $E\{z_1|000\}=E\{z_1|111\}=0$.

Furthermore, each term in Eq. 5-6 can be expanded as the equations show in Eq. 5-7 to Eq. 5-12 below:

$$E\{z_1|001\}=P(y_{x1}>0)-P(y_{x1}\le 0) \quad \text{(Eq. 5-7)}$$

$$E\{z_1|010\}=P(y_{x0}>0 \ \& \ y_{x1}\le 0)-P(y_{x0}\le 0 \ \& \ y_{x1}>0)$$

$$E\{z_1|011\}=P(y_{x0}>0)-P(y_{x0}\le 0) \quad \text{(Eq. 5-9)}$$

$$E\{z_1|110\}=-P(y_{x1}>0)+P(y_{x1}\le 0) \quad \text{(Eq. 5-10)}$$

$$E\{z_1|101\}=-P(y_{x0}>0 \ \& \ y_{x1}\le 0)+P(y_{x0}\le 0 \ \& \ y_{x1}>0)$$

$$E\{z_1|100\}=-P(y_{x0}>0)+P(y_{x0}\le 0) \quad \text{(Eq. 5-12)}$$

By combining and rewriting the equations in Eq. 5-7 to 5-12 above, the algorithm is expressed as Eq. 5-13:

$$E\{z_1\}=\tfrac{1}{4}(2P(y_{x1}>0|001)+P(y_{x0}>0|010)+P(y_{x1}\le 0|010)+2P(y_{x0}>0|011)-3)=0$$

Each probability term in Eq. 5-13 can be found by Eq. 5-14-Eq. 5-19:

$$P(y_{x1}>0|001)=P(h_0-h_1-h_2+h_1^{DFE}+h_2^{DFE}+S1>0)$$

$$P(y_{x0}>0|011)=P(h_0-h_1+h_{-1}+h_1^{DFE}+S2>0)$$

$$P(y_{x0}>0|010)=P(h_0-h_1-h_{-1}+h_1^{DFE}+S2>0)$$

$$P(y_{x1}\le 0|010)=P(-h_0+h_1-h_2-h_1^{DFE}+h_2^{DFE}+S1\le 0)$$

$$S_1=\Sigma_{i=3}^{DFE\ range}(h_i^{xing}-h_i^{DFE})d(k-i)+\Sigma_{i<0 \& i>6}h_i^{xing}d(k-i)$$

$$S_2=\sum_{i=2}^{DFE\ range}(h_i-h_i^{DFE})d(k-i)+\sum_{i<-1}h_id(k-i)+\sum_{i>6}h_id(k-i)$$

By way of example, the PDF's of random variables S1-S2 can be computed numerically by Matlab. Please note that d(k-n) can take two equiprobable $\{-1, 1\}$ values. The same algorithm as developed in the previous section, computes $E\{z_1\}$ for each combination of sampling phase and crossing phase. The CDR converges to the sampling phase i for which the transition at $$i-\frac{N_{ph}}{2}$$

results in $E\{z_1\}=0$ or minimum absolute value of $E\{z_1\}$

FIG. 5 provides a logic diagram of a Quad-Data-Rate (QDR) system. While example embodiments of the present disclosure are being described in reference to the QDR system having 4 channels, the present disclosure is not limited thereto. In other embodiments, the data transmission link may include any suitable number of data links or channels as those skilled in the art would appreciate.

According to FIG. 5, the QDR system 510 incorporates four data links, $w_0$, $w_1$, $w_2$, $w_3$ in parallel. The equations below, i.e., Eq. 6-1, Eq. 6-2, Eq. 6-3 and Eq. 6-4, illustrate how Majority logic works for the QDR system 510:

$$w_1\_up=\frac{w_1(1+w_1)}{2}, \ w_1\_down=\frac{w_1(w_1-1)}{2} \quad \text{(Eq. 6-1)}$$

$$\Delta y=I_{cp}(z_1+z_2) \quad \text{(Eq. 6-2)}$$

$$z_1=(w_0+w_1)\left(1-\frac{w_0 w_1}{2}\right) \quad \text{(Eq. 6-3)}$$

$$z_2=(w_2+w_3)\left(1-\frac{w_2 w_3}{2}\right) \quad \text{(Eq. 6-4)}$$

According to some example embodiments, four phase detectors as in Quad-Data-Rate (QDR) systems: $\{w_0, w_1, w_2, w_3\}\in[-1 \ (down), 1 \ (up)]$. CDR locks such that $E\{\Delta y\}=0\leftrightarrow E\{z_1\}=0$ where $E\{z_1\}=(w_0(up)|w_1(up))\mathbf{31} \ (w_0(dn)\|w_1(dn))$.

As shown in FIG. 5, the logic diagram includes a layer of OR logics having respective outputs that are summed by adders. A difference is then taken of the sums. The layer of OR logics includes OR logics 512, 514, 516 and 518. By way of example, $w_0\_up$ and $w_1\_up$ are OR'd together by the OR logic 512, and $w_2\_up$ and $w_3\_up$ are OR'd together by the OR logic 514. Further, $w_0\_down$ and $w_1\_down$ are OR'd together by the OR logic 516, and $w_2\_down$ and $w_3\_down$ are OR'd together by the OR logic 518. The outputs of the OR logics 512 and 514 are then summed together by an adder 520 to generate y1, and the outputs of the OR logics 516 and 518 are then summed together by an adder 522 to generate y2. Then a difference between y1 and y2 is taken by a difference generator 524 to generate $z_1$ and $z_2$. Finally the outputs are passed through Icp 526 to generate $\Delta y$.

From another perspective of FIG. 5, the difference between the outputs of OR logics 512 and 516 is taken to generate $z_1$, and the difference between the outputs of OR logics 514 and 518 is taken to generate $z_2$. Then, $z_1$ and $z_2$ are summed together to generate $\Delta y$.

The CDR locks when the expected value of the signal should be zero:

$$E\{\Delta y\}=E\{z_1\}=0.$$

Figure 6:
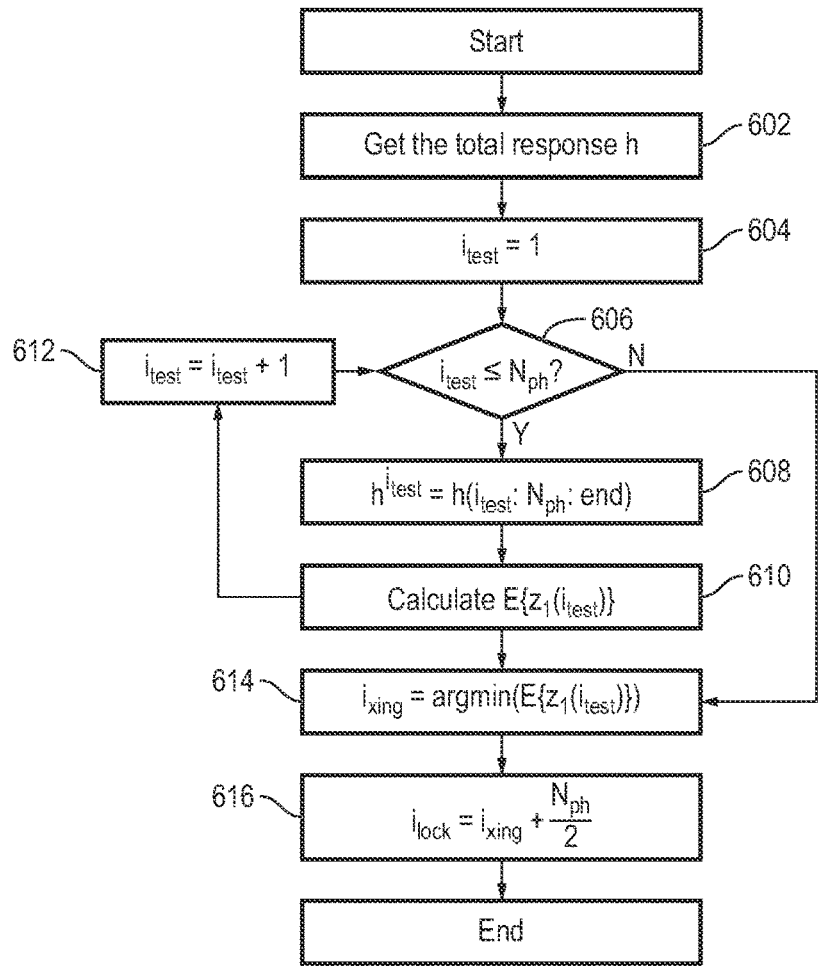
FIG. 6 displays a flow diagram illustrating a third embodiment of the present disclosure.

FIG. 6 displays a flow diagram illustrating a third embodiment of the disclosure.

The flow diagram is based on the following equations Eq. 7-1, Eq. 7-2, Eq. 7-3, Eq. 7-4, Eq. 7-5, Eq. 7-6 and Eq. 7-7:

$$E\{z_1\}=\frac{1}{4}\binom{2P(y_{x1}>0|001)+P(y_{x0}>0|010)+}{P(y_{x1}\le 0|010)+2P(y_{x0}>0|011)-3} \quad \text{(Eq. 7-1)}$$

$$P(y_{x1}>0|001)=P(h^{ixing}[0]-h^{ixing}[1]-h^{ixing}[2]+S_1>0)(Eq.\ 4\text{-}2) \quad \text{(Eq. 7-2)}$$

$$P(y_{x0}>0|010)=P(h^{ixing}[0]-h^{ixing}[1]-h^{ixing}[-1]+S_0>0) \ (Eq.\ 4\text{-}3) \quad \text{(Eq. 7-3)}$$

$$P(y_{x1}>0|010)=P(h^{ixing}[0]+h^{ixing}[1]-h^{ixing}[2]+S_1\le 0) \quad \text{(Eq. 7-4)}$$

$$P(y_{x0}>0|011)=P(h^{ixing}[0]+h^{ixing}[1]+h^{ixing}[-1]+S_0>0) \quad \text{(Eq. 7-5)}$$

$$S_0=\Sigma_{i\ne 0,-1,1}h^{ixing}[i]d[k-i] \quad \text{(Eq. 7-6)}$$

$$S_1=\Sigma_{i\ne 0,1,2}h^{ixing}[i]d[k-i] \quad \text{(Eq. 7-7)}$$

According to the embodiment shown in FIG. 6, the high speed link incorporates majority voting logic. Also, the CDR detector 270 samples data before the DFE 280. This sampling point is indicated as (1) in FIG. 2.

The method, according to this embodiment, begins at Step 602 as shown in FIG. 6. In Step 602, the CDR phase detector 270 measures the overall pulse response of the channel h. In Step 604, the testing phase $i_{test}$ is set equal to 1 as an initial value. In Step 606, the testing phase $i_{test}$ is compared to the phase interpolator/simulation resolution per symbol, $N_{ph}$. If the testing phase is less than or equal to the phase interpolator/simulation resolution per symbol $N_{ph}$, the method will proceed to Step 608.

In Step 608, the overall impulse response $h^{itest}$ for each testing phase $i_{test}$ is measured (or calculated) starting from the current testing phase $i_{test}$. In some embodiments, the overall impulse response is measured (or calculated) from the testing phase $i_{test}$ to end, which means that the overall impulse response is calculated by taking every $(N_{ph})$th sample. By way of example, when $i_{test}=1$ and $N_{ph}=10$, every 10th sample of h (i.e., 1st, 11th, 21st, 31st, etc.) is taken for calculation of the overall impulse response $h^{itest}$. Similarly, when $i_{test}=2$ and $N_{ph}=10$, every 10th sample of h (i.e., 2nd, 12th, 22nd, 32nd, etc.) is taken for calculation of the overall impulse response $h^{itest}$.

The method proceeds to Step 610. In Step 610, the CDR phase detector 270 calculates the expected value $E\{z_i(i_{test})\}$, which is an expected value of $z1(i_{test})$ at each testing phase $i_{test}$. As discussed above in reference to FIG. 5, if the expected value of $\Delta y$, $E\{\Delta y\}$ is zero, then the expected value of $Z_1$, $E\{Z_1\}$ is zero too and vice versa. After calculating the expected value $E\{z_1(i_{test})\}$, the method proceeds to Step 612. In Step 612, the next testing phase $i_{test}$ is selected by increasing the testing phase $i_{test}$ by 1. After selecting the next testing phase, the method returns to Step 606. In Step 606, the next testing phase is compared with the interpolator/simulation resolution per symbol $N_{ph}$. If the next testing phase is less than or equal to the interpolator/simulation resolution per symbol $N_{ph}$, the method will repeat Steps 608-612. In other words, the process of calculating the expected value $E\{z_1(i_{test})\}$ is continued until each value $E\{z_1(i_{test})\}$ is calculated for each of the testing phases $i_{test}$ from the first phase 1 to the last phase $N_{ph}$ according to the resolution of the phases per symbol.

In Step 606, if the testing phase is greater than the phase interpolator/simulation resolution per symbol $N_{ph}$, the expected value $E\{z_1(i_{test})\}$) has been calculated for each of the testing phases $i_{test}$ from $i_{test}=1$ to $i_{test}=N_{ph}$, so the method proceeds to Step 614, in which the crossing phase $i_{xing}$ is determined. In an ideal case, the crossing phase occurs when the expected value $E\{z_1(i_{test})\}$ equals to 0, and the $E\{z_1(i_{test})\}$ of 0 might be achieved according to one or more embodiments of the present disclosure. However, this might not always be the case and the present disclosure is not limited thereto. In some embodiments, the crossing phase $i_{xing}$ is determined by identifying the minimum absolute value of the expected values $E\{z_1(i_{test})\}$ calculated in Step 610. In Step 614, the crossing phase $i_{xing}$ is set equal to the minimum value arg min($E\{z_1(i_{test})\}$) of the expected values $E\{z_1(i_{test})\}$) calculated in Steps 606-612. In Step 616, the final CDR locking phase is set or calculated. In some embodiments, the CDR locking phase is calculated by adding the crossing phase $i_{xing}$ identified in Step 614 to the midpoint of the sample $(N_{ph}/2)$, which is simply the number of all phases per symbol $N_{ph}$ (according to the resolution used) divided by 2. By way of example, when the resolution used is 64 phases per symbol, the midpoint is 64/2=32.

Figure 7:
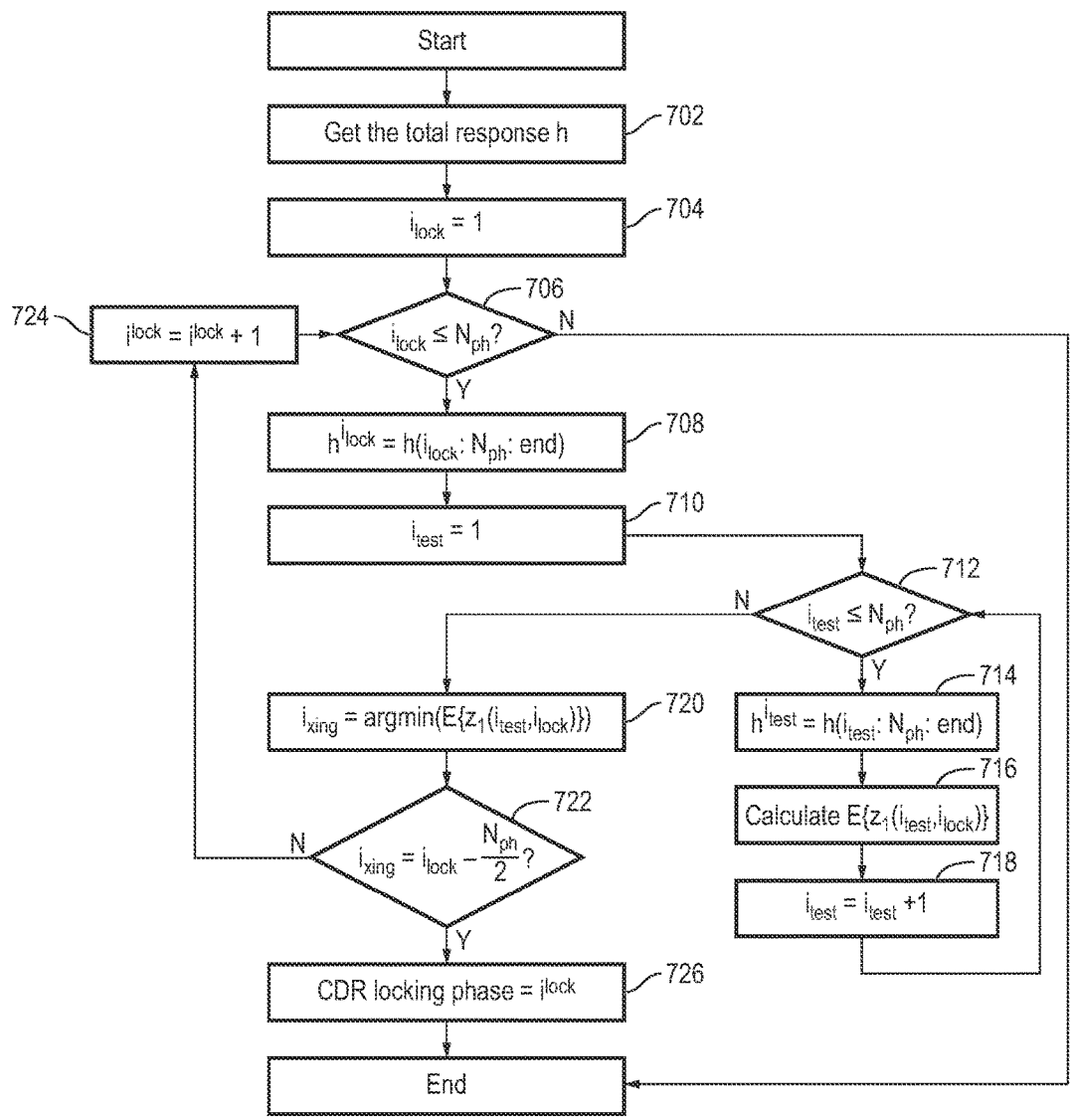
FIG. 7 displays a flow diagram illustrates a fourth embodiment of the present disclosure.

FIG. 7 displays a flow diagram illustrating a fourth embodiment of the present disclosure.

The flow diagram is based on the following equations Eq. 8-1, Eq. 8-2, Eq. 8-3, Eq. 8-4 and Eq. 8-5:

$$E\{z_1\}=\text{the same as embodiment in FIG. 6} \quad \text{(Eq. 8-1)}$$

$$P(y_{x1}>0|001)=P(h^{ixing}[0]-h^{ixing}[1]-h^{ixing}[2]+h^{ilock}[1]+h^{ilock}[2]+S_1>0) \quad \text{(Eq. 8-2)}$$

$$P(y_{x0}>0|010)=P(h^{ixing}[0]-h^{ixing}[1]+h^{ilock}[1]-h^{ixing}[-1]+S_0>0) \quad \text{(Eq. 8-3)}$$

$$P(y_{x1}\leq 0|010)=P(-h^{ixing}[0]+h^{ixing}[1]-h^{ixing}[2]-h^{ilock}[1]+h^{ilock}[2]+S_1\leq 0) \quad \text{(Eq. 8-4)}$$

$$P(y_{x0}>0|011)=P(h^{ixing}[0]-h^{ixing}[1]+h^{ilock}[1]+h^{ixing}[-1]+S_0>0) \quad \text{(Eq. 8-5)}$$

According to the embodiment shown in FIG. 7, the high speed link incorporates a majority voting logic. Also, the CDR phase detector 270 samples data after the DFE 280, which sampling point is indicated as (2) in FIG. 2. This arrangement results in CDR phase detector 270 interaction with DFE 280, which can impact the CDR locking phase.

The method, according to this embodiment, begins at Step 702 as shown in FIG. 7. In Step 702, the CDR phase detector 270 measures the overall pulse response of the channel h. In Step 704, the locking phase $i_{lock}$ is set equal to 1 as an initial value. In Step 706, the locking phase is compared to the phase interpolator/simulation resolution per symbol, $N_{ph}$. If the locking phase is less than or equal to the phase interpolator/simulation resolution per symbol $N_{ph}$, the method will proceed to Step 708.

In Step 708, the overall impulse response $h^{ilock}$ for each locking phase $i_{lock}$ is measured (or calculated) starting from the current locking phase $i_{lock}$. In some embodiments, the overall impulse response is measured (or calculated) from the locking phase $i_{lock}$ to end, which means that the overall impulse response is calculated by taking every $(N_{ph})$th sample. By way of example, when $i_{lock}=1$ and $N_{ph}=10$, every 10th sample of h (i.e. 1st, 11th, 21st, 31st, etc.) is taken for calculation of the overall impulse response $h^{illock}$ Similarly, when $i_{lock}=2$ and $N_{ph}=10$, every 10th sample of h (i.e., 2nd, 12th, 22nd, 32nd, etc.) is taken for calculation of the overall impulse response $h^{ilock}$.

The method proceeds to Step 710. In Step 710, the testing phase is set equal to 1 as an initial value. In Step 712, the testing phase $i_{test}$ is compared to the phase interpolator/simulation resolution per symbol, $N_{ph}$. If the testing phase is less than or equal to the interpolator/simulation resolution per symbol $N_{ph}$, the method will proceed to Step 714.

In Step 714, the overall impulse response $h^{itest}$ for each testing phase $i_{test}$ is measured (or calculated) starting from the current testing phase $i_{test}$. In some embodiments, the overall impulse response is measured (or calculated) from the testing phase $i_{test}$ to end, which means that all the overall impulse response is calculated by taking every $(N_{ph})$th sample. By way of example, when $i_{test}=1$ and $N_{ph}=10$, every 10th sample of h (i.e., 1st, 11th, 21st, 31st, etc.) is taken for calculation of the overall impulse response $h^{itest}$.

The method then proceeds to Step 716. In Step 716, the CDR phase detector 270 calculates the expected value $E\{z_1(i_{test}, i_{lock})\}$ at the each testing phase $i_{test}$ and at each locking phase $i_{lock}$. As discussed above in reference to FIG. 5, if the expected value of $\Delta y$, $E\{\Delta y\}$ is zero, then the expected value of $Z_1$, $E\{Z_1\}$ is zero too and vice versa. After calculating the expected value $E\{z_1(i_{test}, i_{lock})\}$, the method proceeds to Step 718. In Step 718, the next testing phase is selected by increasing the testing phase by 1. After selecting the next testing phase, the method returns to Step 712. In Step 712, the next testing phase is compared with the interpolator/simulation resolution per symbol $N_{ph}$. If the next testing phase is less than or equal to the interpolator/simulation resolution per symbol $N_{ph}$, the method will repeat Steps 714-718. In other words, the process of calculating the expected value $E\{z_1(i_{test}, i_{lock})\}$ is continued until each expected value $E\{z_1(i_{test}, i_{lock})\}$ is calculated for the current locking phase $i_{lock}$ and each of the testing phases $i_{test}$ from the first testing phase 1 to the last testing phase $N_{ph}$ according to the resolution of the phase per symbol.

In Step 712, if the testing phase is greater than the phase interpolator/simulation resolution per symbol $N_{ph}$, the expected value $E\{z_1(i_{test}, i_{lock})\}$ has been calculated for the current locking phase $i_{lock}$ and each of the testing phases $i_{test}$ from $i_{test}=1$ to $i_{test}=N_{ph}$ at the current locking phase $i_{lock}$, and the method proceeds to Step 720, in which the crossing phase $i_{xing}$ is determined. In an ideal case, the crossing phase occurs when the expected value $E\{z_1(i_{test}, i_{lock})\}$ equals to 0, and the expected value $E\{z_1(i_{test}, i_{lock})\}$ of 0 might be achieved according to one or more embodiments of the present disclosure. However, this might not always be the case and the present disclosure is not limited thereto. In some embodiments, the crossing phase $i_{xing}$ is determined by identifying the minimum value of the expected values $E\{z_1(i_{test}, i_{lock})\}$ calculated in Step 716. In Step 720, the crossing phase $i_{xing}$ is set when arg min($E\{z_1(i_{test}, i_{lock})\}$) of the expected values $E\{z_1(i_{test}, i_{lock})\}$ calculated in Steps 712-718 is at the minimum.

In Step 722, the crossing phase $i_{xing}$ calculated in Step 720 is compared to the difference of the current locking phase $i_{lock}$ and the midpoint of the sample $N_{ph}/2$, which is simply the number of all phases per symbol $N_{ph}$ (according to the resolution used) divided by 2. By way of example, when the resolution used is 64 phases per symbol, the midpoint is 64/2=32. If the crossing phase $i_{xing}$ is equal to the difference, then the method proceeds to Step 726. In step 726, the final CDR locking phase is set equal to the current locking phase $i_{lock}$.

Referring back to Step 722, if the crossing phase is not equal to the difference of the current locking phase $i_{lock}$ and the midpoint of the sample ($N_{ph}/2$), then the method proceeds to Step 724. In Step 724, the next locking phase is selected by increasing the locking phase $i_{lock}$ by 1. After selecting the next locking phase, the method returns to Step 706. In Step 706, the next locking phase is compared with the interpolator/simulation resolution per symbol $N_{ph}$. If the next locking phase is less than or equal to the interpolator/simulation resolution per symbol, the method will repeat Steps 708-722. In other words, the process of calculating the crossing phase $i_{xing}$ is continued until a crossing phase $x_{ing}$ is calculated that is equal to the difference of the locking phase $i_{lock}$ and the midpoint of the sample $N_{ph}/2$ or until each crossing phase $i_{xing}$ is calculated for each of the locking phases $i_{lock}$ from the first locking phase 1 to the last locking phase $N_{ph}$ according to the resolution of the phases per symbol.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The inventive concept is defined by the following claims, with equivalents of the claims to be included therein.

Features of the inventive concept and methods of accomplishing the same may be understood more readily by reference to the aforementioned detailed description of embodiments and the accompanying drawings. The aforesaid embodiments were described in more detail with reference to the accompanying drawings, in which like reference numbers refered to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of embodiments of the present disclosure may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

In the previous description, for the purposes of explanation, numerous specific details were set forth to provide a thorough understanding of various embodiments. It is apparent, however, that various embodiments may be practiced without these specific details or with one or more equivalent arrangements. Further, one of ordinary skills in the art would appreciate that various features of two or more embodiments described herein may be combined in any suitable manner without departing from the spirit or scope of the present disclosure. In other instances, well-known structures and devices are shown in block diagram form in order to avoid unnecessarily obscuring various embodiments.

It is understood that when an element, layer, region, or component was referred to as being "on," "connected to," or "coupled to" another element, layer, region, or component, it can be directly on, connected to, or coupled to the other element, layer, region, or component, or one or more intervening elements, layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it is understood that when an element or layer was referred to as being "between" two elements or layers, it can be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicated otherwise. It is further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the disclosure refers to "one or more embodiments of the disclosure." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

What is claimed is:

1. A method for determining a clock and data recovery (CDR) locking phase in a data communication system, the method comprising:
    calculating, by a processor, an overall pulse response of the data communication system;
    obtaining, by the processor, a function value for each of a plurality of phases, the plurality of phases corresponding to a resolution per symbol;
    setting, by the processor, a crossing phase to be a phase at which the function value is minimum from among the plurality of phases; and
    setting, by the processor, the CDR locking phase to be the crossing phase plus a midpoint from among the plurality of phases.

2. The method according to claim 1, wherein the data communication system comprises a plurality of channels, and the function value comprises an expected value of a logic output corresponding to the plurality of channels.

3. The method according to claim 1, wherein the obtaining the function value for each of a plurality of phases comprises calculating the function value corresponding to all of the plurality of phases at each of the plurality of phases.

4. The method according to claim 3, wherein the data communication system comprises a plurality of channels, and the obtaining the function value comprises an expected value of a logic output corresponding to the plurality of channels.

5. The method according to claim 1, wherein the data communication system comprises a SerDes link.

6. A receiver for a data communication system, the receiver comprising a Clock and Data Recovery (CDR) phase detector, wherein the CDR phase detector is configured to:
    calculate an overall pulse response of the data communication system;
    obtain a function value for each of a plurality of phases, the plurality of phases corresponding to a resolution per symbol;
    set a crossing phase to be a phase at which the function value is minimum from among the plurality of phases; and
    set a CDR locking phase to be the crossing phase plus a midpoint from among the plurality of phases.

7. The receiver according to claim 6, wherein the data communication system comprises a plurality of channels, and the function value comprises an expected value of a logic output corresponding to the plurality of channels.

8. The receiver according to claim 6, wherein the CDR phase detector is configured to calculate the function value corresponding to all of the plurality of phases at each of the plurality of phases.

9. The receiver according to claim 8, wherein the data communication system comprises a plurality of channels, and the function value comprises an expected value of a logic output corresponding to the plurality of channels.

10. The receiver according to claim 6, wherein the receiver further comprises a deserializer of a SerDes link for the data communication system.

11. The receiver according to claim 6, wherein the receiver further comprises:
    a continuous time linear equalizer (CTLE) configured to receive data transmitted over a channel of the data communication system;
    a decision-feedback equalizer (DFE) coupled to the CDR phase detector; and
    a deserializer configured to deserialize the data received over the channel.

12. The receiver according to claim 6, wherein the CDR phase detector comprises an Alexander Phase Detector.

13. A data communication system comprising a transmitter configured to transmit data;
    a channel configured to carry the data from the transmitter; and
    a receiver configured to receive the data over the channel, the receiver comprising a Clock and Data Recovery (CDR) phase detector, wherein the CDR phase detector is configured to:
    calculate an overall pulse response of the data communication system;
    obtain a function value for each of a plurality of phases, the plurality of phases corresponding to a resolution per symbol;
    set a crossing phase to be a phase at which the function value is minimum from among the plurality of phases; and
    set a CDR locking phase to be the crossing phase plus a midpoint from among the plurality of phases.

14. The system according to claim 13, wherein the channel comprises a plurality of channels, and the function value comprises an expected value of a logic output corresponding to the plurality of channels.

15. The system according to claim 13, wherein the CDR phase detector is configured to calculate the function value corresponding to all of the plurality of phases at each of the plurality of phases.

16. The system according to claim 15, wherein the channel comprises a plurality of channels, and the function value comprises an expected value of a logic output corresponding to the plurality of channels.

17. The system according to claim 13, wherein the transmitter and the receiver constitute a SerDes link.

18. The system according to claim 13, wherein the CDR phase detector comprises an Alexander's Phase Detector.

19. The system according to claim 13, wherein the receiver further comprises:
   a continuous time linear equalizer (CTLE) configured to receive the data transmitted over the channel;
   a decision-feedback equalizer (DFE) coupled to the CDR phase detector; and
   a deserializer configured to deserialize the data received over the channel.

20. The system according to claim 13, wherein the transmitter comprises:
   a serializer configured to serialize the data; and
   a linear finite-impulse-response filter (TxFIR) interposed between the serializer and the channel.

* * * * *